(12) United States Patent
Morris

(10) Patent No.: US 8,539,139 B1
(45) Date of Patent: Sep. 17, 2013

(54) MANAGING DEVICE WEAROUT USING I/O METERING

(75) Inventor: John Mark Morris, San Diego, CA (US)

(73) Assignee: Teradota US, Inc., Dayton, OH (US)

( * ) Notice: Subject to any disclaimer, the term of this patent is extended or adjusted under 35 U.S.C. 154(b) by 376 days.

(21) Appl. No.: 12/971,168

(22) Filed: Dec. 17, 2010

(51) Int. Cl.
- *G06F 12/00* (2006.01)
- *G06F 13/00* (2006.01)
- *G06F 13/28* (2006.01)
- *G11C 11/34* (2006.01)
- *G11C 16/04* (2006.01)

(52) U.S. Cl.
USPC ........... 711/103; 711/154; 711/165; 711/167; 365/185.33

(58) Field of Classification Search
USPC ............. 711/103, 154, 165, 167; 365/185.33
See application file for complete search history.

(56) References Cited

U.S. PATENT DOCUMENTS

| | | | |
|---|---|---|---|
| 6,850,443 B2 * | 2/2005 | Lofgren et al. | 365/185.29 |
| 7,467,253 B2 | 12/2008 | Yero | |
| 7,689,762 B2 | 3/2010 | Hobson | |
| 7,802,064 B2 | 9/2010 | Kim | |
| 2009/0259819 A1 * | 10/2009 | Chen et al. | 711/165 |
| 2010/0268865 A1 * | 10/2010 | Ramiya Mothilal | 711/103 |

OTHER PUBLICATIONS

"STEC Small Cards Wear Leveling and Lifetime Calculator", *STEC Application Note AN-0702*, (Jan. 5, 2008).
Perdue, Ken "Wear Leveling", *Spansion Application Note, Wear Leveling AN, Revision 01*, (Apr. 30, 2008).

"USB Flash Wear-Leveling and Life Span", *Corsair Frequently Asked Questions*, (Jun. 2007).

* cited by examiner

*Primary Examiner* — Ryan Bertram
(74) *Attorney, Agent, or Firm* — Howard Speight

(57) ABSTRACT

The number of writes to a device ("$D_{1-n}$") consisting of n sub-devices ("$D_a$") is counted:

$$\begin{bmatrix} W_{1,1} & \ldots & W_{1,m-1} & W_{1,m} \\ W_{2,1} & \ldots & W_{2,m-1} & W_{2,m} \\ \ldots & \ldots & \ldots & \ldots \\ W_{n,1} & \ldots & W_{n,m-1} & W_{n,m} \end{bmatrix}$$

where:
$W_{a,b}$ is the number of writes to sub-device $D_a$ in time period "b";
n>1;
m>1.
A write rate is determined for each sub-device $D_a$ at the end of time period p ("$WR_{a,p}$") using the following equation:

$$WR_{a,p} = \frac{\sum_{b=1}^{p} W_{a,b}}{\sum_{b=1}^{p} t_b}$$

where:
$t_b$ is the amount of time in time period "b";
p<m.
The write rate to sub-device $D_a$ is controlled in time periods after time period p so that device $D_{1-n}$ will have a guaranteed lifetime ("$LD_{1-n}$").

20 Claims, 6 Drawing Sheets

MANAGING DEVICE WEAROUT USING I/O METERING

BACKGROUND

Some non-volatile storage technologies, for example, Solid State Disk ("SSD") storage, have a limited of the number of times they can be written. These devices are often organized in pages or cells and each cell may have a specified write limit. One particular technology called Single Layer Cell ("SLC") often specifies that each cell can be written 100,000 times while the device still maintains the ability to accomplish those writes successfully and continue to meet its other specifications. Another type of solid state disk, called Multi Layer Cell ("MLC"), has cell write specifications of 10,000 or even 5,000 writes. The vendors of these devices couple controllers and software/firmware to provide what is called "wear-leveling technology." Wear-leveling technology keeps track of how often each physical cell has been written and will move data around and switch logical addresses so as to even out the wear on all cells. Often these wear-leveling technologies also use a set of spare cells to provide a working set for moving data and for pre-erasing cells to improve performance. The better of the wear-leveling technologies have a low write expansion factor, meaning that the algorithm itself imposes a small to negligible amount of write activity.

SUMMARY

In general, in one aspect, the invention features a method. The method includes counting a number of writes to a device ("$D_{1-n}$") consisting of n sub-devices ("$D_a$"):

$$\begin{bmatrix} W_{1,1} & \ldots & W_{1,m-1} & W_{1,m} \\ W_{2,1} & \ldots & W_{2,m-1} & W_{2,m} \\ \ldots & \ldots & \ldots & \ldots \\ W_{n,1} & \ldots & W_{n,m-1} & W_{n,m} \end{bmatrix}$$

where:
$W_{a,b}$ is the number of writes to sub-device $D_a$ in time period "b";
n>1;
m>1.

The method further includes for each sub-device $D_a$ determining a write rate for sub-device $D_a$ at the end of time period p ("$WR_{a,p}$") using the following equation:

$$WR_{a,p} = \frac{\sum_{b=1}^{p} W_{a,b}}{\sum_{b=1}^{p} t_b}$$

where:
$t_b$ is the amount of time in time period "b";
p<m.

The method further includes controlling the write rate to sub-device $D_a$ in time periods after time period p so that device $D_{1-n}$ will have a guaranteed lifetime ("$LD_{1-n}$").

Implementations of the invention may include one or more of the following. Controlling the write rate to $D_a$ in time periods after time period p may include controlling the write rate to $D_a$ in time periods after time period p to make the overall write rate computed at the end of a time period q after time period p ("$WR_{a,q}$") less than an allowed overall write rate for $D_a$ ("$WA_a$") so that device $D_{1-n}$ will have lifetime $LD_{1-n}$, where:

$$WA_a = \frac{W_{spec}}{LD_{1-n}}, \text{ and}$$

$W_{spec}$ is the specification for the total number of writes to device $D_{1-n}$ in its lifetime.

A curve representing $WA_a$ over time from an origin to $LD_{1-n}$ may have a shape selected from a group consisting of a straight line, a segmented line having levels and durations, and a curve. A user may be allowed to select the levels and durations of the segmented line. Controlling the write rate to sub-device $D_a$ in time periods after time period p may include accumulating write rate credits in low write activity time periods for use in high activity time periods. Controlling the write rate to sub-device $D_a$ in time periods after time period p may include allowing high write rates in time periods while keeping an average write rate for $D_a$ ("$WA_a$") so that device $D_{1-n}$ will have lifetime $LD_{1-n}$, where:

$$WA_a = \frac{W_{spec}}{LD_{1-n}}, \text{ and}$$

$W_{spec}$ is the specification for the total number of writes to device $D_{1-n}$ in its lifetime.

A user may be allowed to adjust $LD_{1-n}$.

In general, in another aspect, the invention features a database system. The database system includes one or more nodes. The database system includes a plurality of CPUs, each of the one or more nodes providing access to one or more CPUs. The database system includes a plurality of virtual processes, each of the one or more CPUs providing access to one or more virtual processes. Each virtual process is configured to manage data, including rows from the set of database table rows, stored in one of a plurality of data-storage facilities. The database system includes a process. The process counts a number of writes to a device ("$D_{1-n}$") consisting of n sub-devices ("$D_a$"):

$$\begin{bmatrix} W_{1,1} & \ldots & W_{1,m-1} & W_{1,m} \\ W_{2,1} & \ldots & W_{2,m-1} & W_{2,m} \\ \ldots & \ldots & \ldots & \ldots \\ W_{n,1} & \ldots & W_{n,m-1} & W_{n,m} \end{bmatrix}$$

where:
$W_{a,b}$ is the number of writes to sub-device $D_a$ in time period "b";
n>1;
m>1.

For each sub-device $D_a$, the process determines a write rate for sub-device $D_a$ at the end of time period p ("$WR_{a,p}$") using the following equation:

$$WR_{a,p} = \frac{\sum_{b=1}^{p} W_{a,b}}{\sum_{b=1}^{p} t_b}$$

where:
$t_b$ is the amount of time in time period "b";
p<m.

The process controls the write rate to sub-device $D_a$ in time periods after time period p so that device $D_{1-n}$ will have a guaranteed lifetime ("$LD_{1-n}$").

In general, in another aspect, the invention features a computer program, stored in a computer-readable tangible medium. The program includes executable instructions that cause a computer to count a number of writes to a device ("$D_{1-n}$") consisting of n sub-devices ("$D_a$"):

$$\begin{bmatrix} W_{1,1} & \cdots & W_{1,m-1} & W_{1,m} \\ W_{2,1} & \cdots & W_{2,m-1} & W_{2,m} \\ \cdots & \cdots & \cdots & \cdots \\ W_{n,1} & \cdots & W_{n,m-1} & W_{n,m} \end{bmatrix}$$

where:
$W_{a,b}$ is the number of writes to sub-device $D_a$ in time period "b";
n>1;
m>1.

For each sub-device $D_a$, the computer determines a write rate for sub-device $D_a$ at the end of time period p ("$WR_{a,p}$") using the following equation:

$$WR_{a,p} = \frac{\sum_{b=1}^{p} W_{a,b}}{\sum_{b=1}^{p} t_b}$$

where:
$t_b$ is the amount of time in time period "b";
p<m.

The computer controls the write rate to sub-device $D_a$ in time periods after time period p so that device $D_{1-n}$ will have a guaranteed lifetime ("$LD_{1-n}$").

DETAILED DESCRIPTION

Some system vendors offer long term warranties or service plans with expectations of 3, 5, or even 7.5 years of lifetime from a I/O-limited device, which is defined to be a device with a limited number of lifetime reads or writes, such as an SLC device or an MLC device. Were an application were to write to such a I/O-limited device at full speed, the write cycles available to the I/O-limited device might be consumed long before the typical lifetime expectation and before the warranted lifetime.

A wear-leveling technique is provided that that improves the likelihood that an I/O-limited device will achieve a specified lifetime, where lifetime is expressed in units of time.

Figure 1:
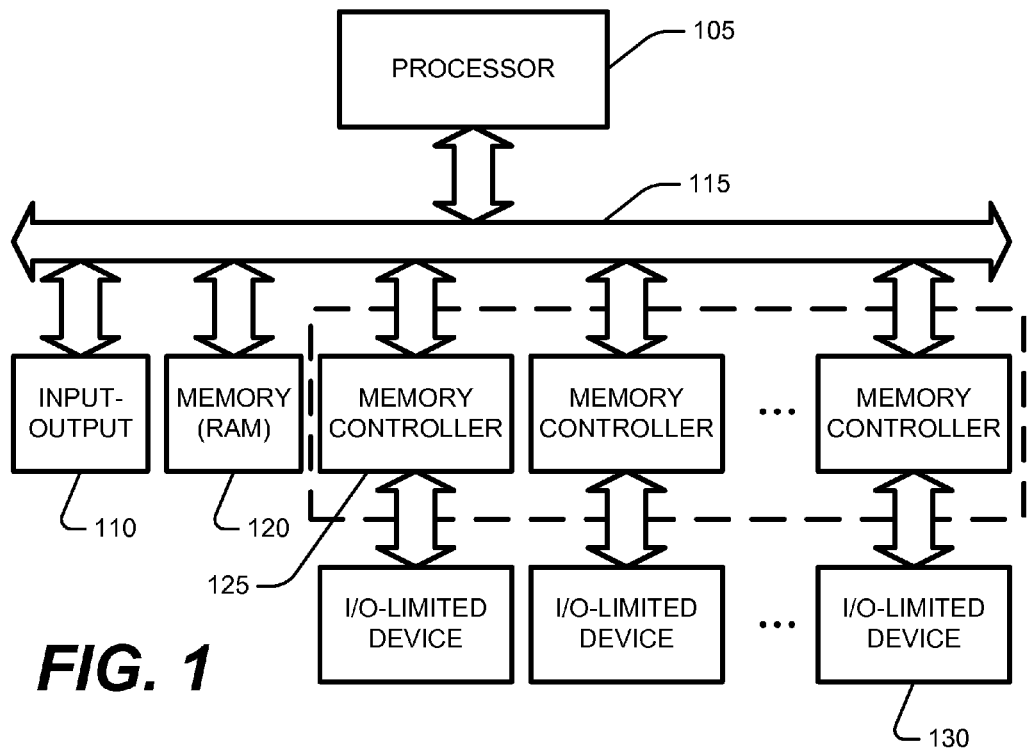
FIG. 1 illustrates a system that includes write-limited devices.

One embodiment of an environment for such a wear-leveling technique, illustrated in FIG. 1, includes a processor 105, which can be any processing device, including a microprocessor, a main frame computer, or a massively parallel array of processors. In one embodiment, input/output ("I/O") 110, provides the ability to interface with peripherals, such as keyboards, mice, displays and monitors, external memory, networks, and other such peripherals. In one embodiment, the various peripherals communicate with a processor through the I/O 110 and a bus 115. In one embodiment, a memory 120, which can include random access memory ("RAM"), programmable read only memory ("PROM"), electrically alterable, or programmable, read only memory ("EAROM" or "EPROM"), or similar memory that can be used by the processor for temporary or permanent storage of executable code or of transitory data that might be stored in, for example, registers.

In one embodiment, memory controllers 125 (only one is labeled) provide an interface between I/O-limited device 130 (only one is labeled) and the bus. Thus, in one embodiment, the processor 105 or any other device (e.g., the memory 120 or a peripheral through I/O 110) can access an I/O-limited device 130 through the respective memory controller.

In one embodiment, all of the memory controllers illustrated in FIG. 1 are included in a single device, as indicated by the dashed box around the memory controllers 125. In one embodiment, a plurality of memory controllers each provides an interface with one or more I/O-limited device.

In one embodiment, each I/O-limited device 130 can be inserted or removed from the system. In one embodiment, for example, each I/O-limited device 130 is a USB "thumb" drive and can be attached to the system by plugging it into one of a plurality of universal serial bus ("USB") ports provided by the system. Similarly, in one embodiment, each I/O-limited device 130 can be removed from the system by following the procedures for removing a device appropriate for the operating system being used and removing the I/O-limited device 130 from the USB port to which it is connected.

Further, in one embodiment, each I/O-limited device 130 can be attached to any memory controller 125. That is, in one embodiment, each memory controller is coupled to a USB port that is accessible to the outside world. In one embodiment, any of the I/O-limited device 130 can be plugged in to any of the USB ports.

Figure 2:
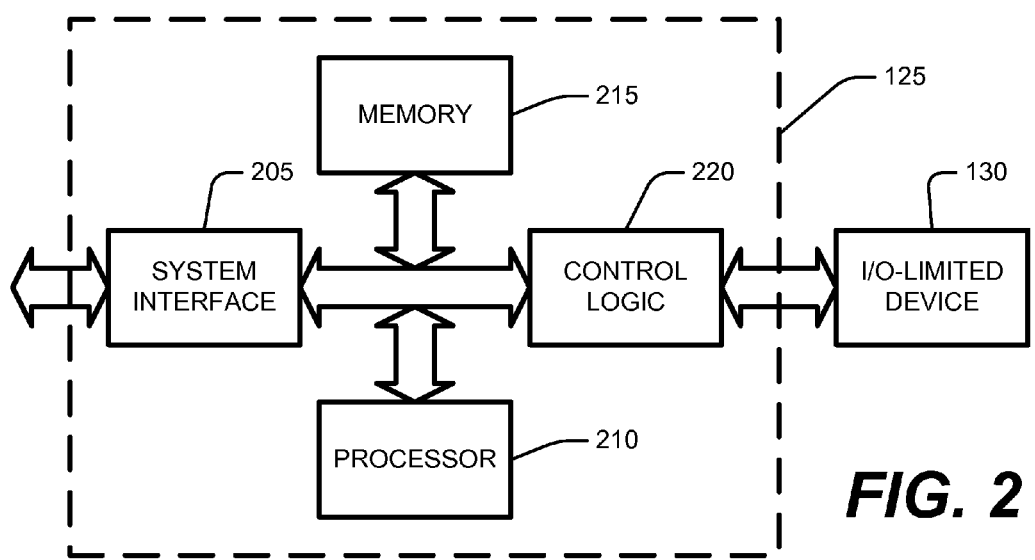
FIG. 2 illustrates a memory controller.

One embodiment of a memory controller 125, shown in more detail in FIG. 2, includes a system interface 205 by which the memory controller communicates with through the bus 115 to the rest of the world. In one embodiment, a processor (such as a microprocessor, a programmable logic array, or the like) 210 provides the processing power necessary to perform the functions of the memory controller 125. In one embodiment, a memory 215, which can be any combination of a RAM, ROM, EPROM, EAROM, or the like, provides a place where executable code, registers, etc. can be stored by the processor 210. In addition, in one embodiment, the memory 215 acts as a buffer to store data to be sent to or retrieved from the I/O-limited device 130. In one embodiment, control logic 220 controls the storage and retrieval of data from the I/O-limited device 130.

In one embodiment, the wear-leveling technique uses I/O metering technology to control the write rate to a I/O-limited device 130. For each I/O-limited device 130, a history is maintained of writes accumulating to that device and the ongoing write rate is controlled such that the specified write cycles of the I/O-limited device 130 will not be exceeded.

In one embodiment of the invention a lifetime average write rate is calculated for a I/O-limited device 130 and the actual write rate to that device is not allowed to exceed the lifetime average write rate. In one embodiment, the actual write rate is periodically computed as an average of number of write cycles to the device divided by the amount of time over which those writes were made. In one embodiment, the actual write rate is periodically computed by dividing the number of writes over a window of time by the length of the time window. In one embodiment, the window of time ends at or near the time the actual write rate is computed. In one embodiment, the window of time ends at a time earlier than the time the actual write rate is computed. These embodiments do not require keeping track of specific devices.

In one embodiment individual devices are tracked. In one embodiment, the tracking is by address location in a computer system. In one embodiment, the tracking is by unique serial numbers associated with the I/O-limited device 130.

Figure 3:
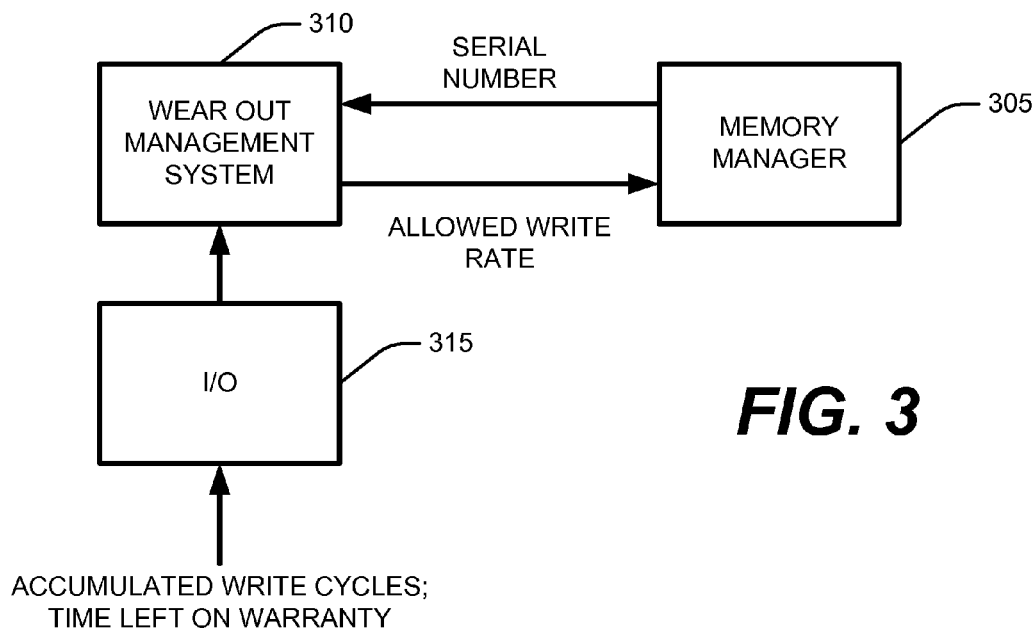
FIG. 3 illustrates one embodiment of the processing associated with inserting a write-limited device into a system.
Figure 4:
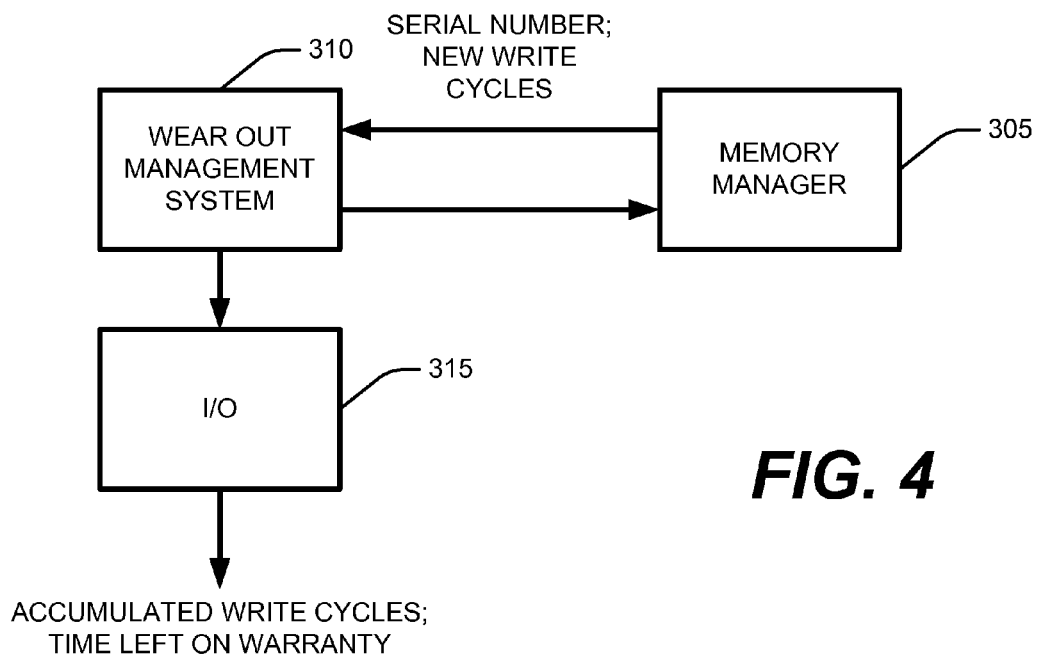
FIG. 4 illustrates one embodiment of the processing associated with removing a write-limited device into the system.

In one embodiment, illustrated in FIGS. 3 and 4, when I/O-limited device 130 are removed and reintroduced into a system, as discussed above, the accumulated write cycles are communicated via entering that information through an interface.

One embodiment of the processing associated with inserting an I/O-limited device into a system, illustrated in FIG. 3, includes a memory manager process 305, a wear out management system 310, and an I/O process 315. In various embodiments, these processes run on the processor 105, on the processor 215 associated with the memory controller, or they are shared between the two types of processor.

In one embodiment, the memory manager 305 manages storing data on the I/O-limited device. In one embodiment, this includes maintaining tables to reflect the mapping between logical addresses used by the system and physical addresses on the I/O-limited device that the memory manager 305 is managing. In one embodiment, the memory manager 305 also storing data to and retrieving data from the I/O-limited device. In one embodiment, this data includes data about the I/O-limited device, including for example the serial number of the I/O-limited device. In one embodiment, the memory manager 305 also manages the data being written to the I/O-limited device to keep the actual write rate to the I/O-limited device to within an allowed write rate that the memory manager 305 is provided. In one embodiment, it does this by using the memory 215 to buffer data to reduce the write rate to a particular I/O-limited device.

In one embodiment, when an I/O-limited device is attached to the system, as shown in FIG. 3, the memory manager extracts the serial number from the I/O-limited device and reports it to the wear out management system 310. In one embodiment, the wear out management system 310 uses the I/O 315 to query a user concerning the accumulated write cycles and the period of time left in its warranty. In one embodiment, the user responds with the requested information, which the wear out management system uses to compute an allowed write rate for the newly installed I/O-limited device. In one embodiment, the wear out management system 310 provides the allowed write rate to the memory manager 305, which then manages writes to the I/O-limited device according to the allowed write rate. In one embodiment, the serial number is not provided by the memory manager 305 but is instead provided by the user through the I/O 315 as part of the querying process described above.

In one embodiment, as shown in FIG. 4, when the I/O-limited device is removed from the system, the memory manager 305 reports the serial number of the I/O-limited device and the number of new write cycles that the I/O-limited device experienced while it was installed in the system. In one embodiment, the wear out management system 310 computes the accumulated write cycles by adding the new write cycles to the accumulated write cycles that it received from the user when the I/O-limited device was installed and the time left on warranty by subtracting the time that it was installed in the system from the time left on warranty that it was supplied by the user. In one embodiment, the wear out management system 310 reports that information, and, in one embodiment, the serial number of the I/O-limited device, to the user through the I/O 315. In one embodiment, the user records the information.

Figure 5:
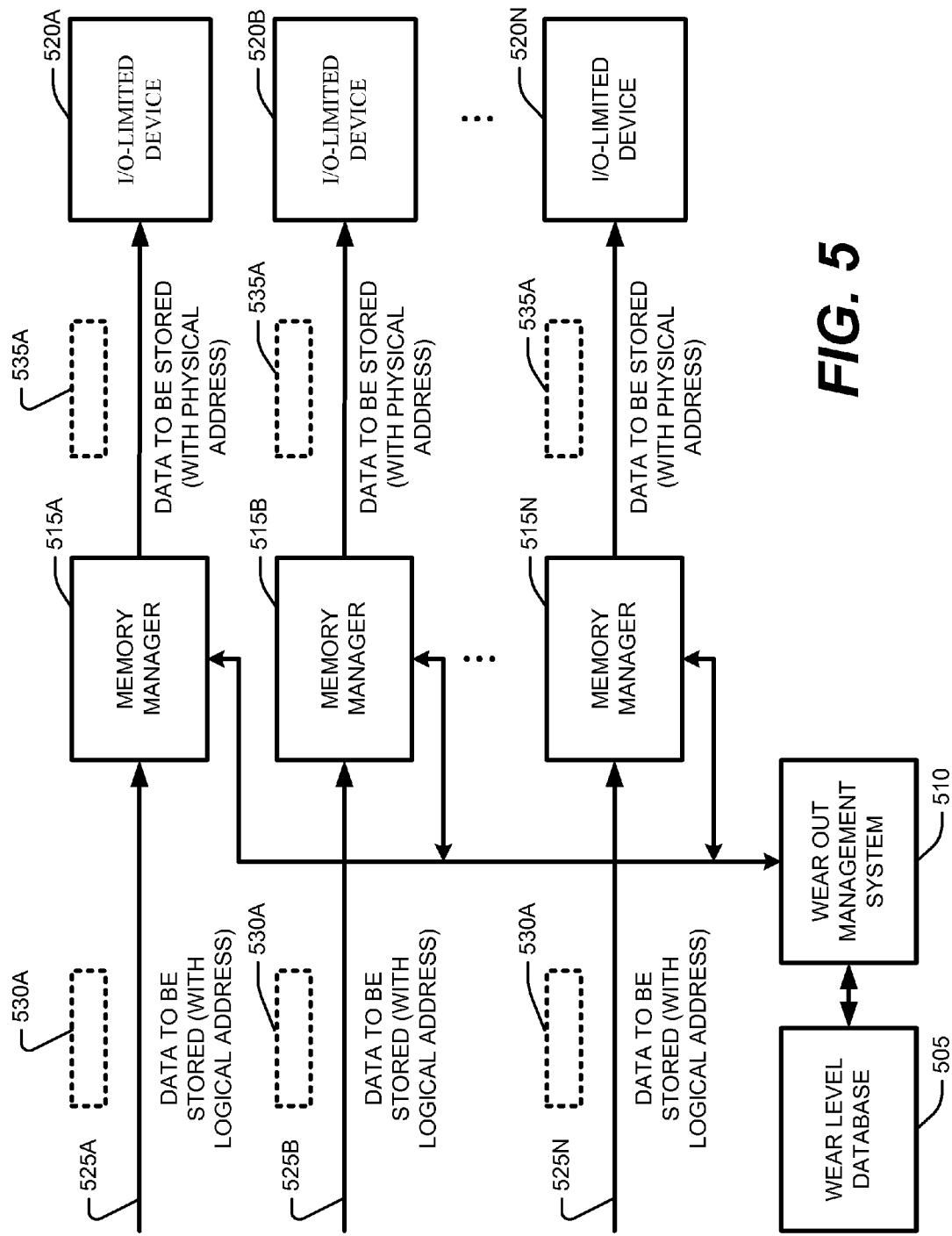
FIG. 5 is a block diagram.

In one embodiment, illustrated in FIG. 5, the accumulated write cycles are queried from a wear level database 505 which is indexed by device serial number. In one embodiment, the wear level database 505 is periodically updated with usage information from all SLC or MLC devices under control of a wear out management system 510.

In one embodiment, the system illustrated in FIG. 5 includes memory mangers 515A-515N that control I/O-limited devices. Note that while A-N such devices are shown for simplicity, it will be understood that one or more of such devices may not be installed in the system. Further, it will be understood that one or more of the memory mangers may manage more than one I/O-limited device.

In one embodiment, the memory manager performs the same functions described above with respect to FIGS. 3 and 4. In one embodiment, the wear out management system 510 stores data provided by the respective memory managers 515A-N, such as serial number, actual writes, connection time, etc., in the wear level database 505.

In one embodiment, the remaining lifetime of an I/O-limited device is provided to the wear out management system 510 along with the write cycle limitations and the device capacity and the wear out management system 510 dynamically adjusts the allowed write rate accordingly. In one embodiment, the write cycle limitations and device capacity are provided to the wear out management system through an I/O (not shown) such as that described above in connection with FIGS. 3 and 4. In one embodiment, that information is stored in the wear level database 505 and can be retrieved by the wear out management system 510.

Figure 6:
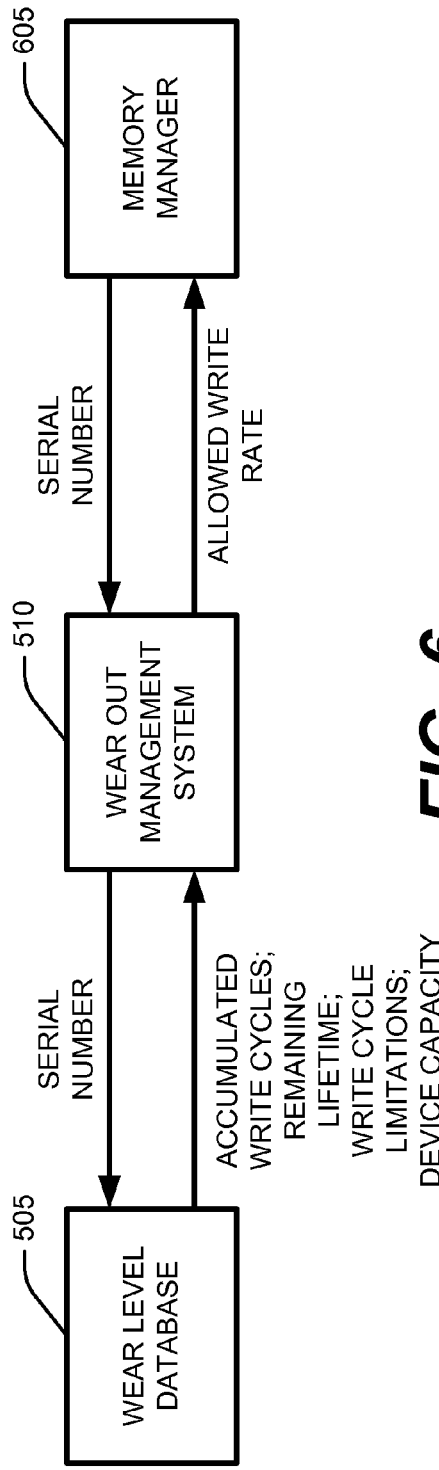
FIGS. 6 and 7 are data flow diagrams.

In one embodiment, illustrated in FIG. 6, when a SLC or MLC device is inserted into the system, a memory manager 605 retrieves the serial number from the SLC or MLC device and provides it to the wear out management system 510. In one embodiment, the wear out management system 510 uses the serial number to retrieve the accumulated write cycles, remaining lifetime, write cycle limitations, and device capacity from the wear level database 505.

In one embodiment, the wear out management system 510 uses that information to determine an allowed write rate, which it provides to the memory manager 605. In one embodiment, the memory manager 605 manages writes to its SLC or MLC device to achieve the allowed write rate.

Figure 7:
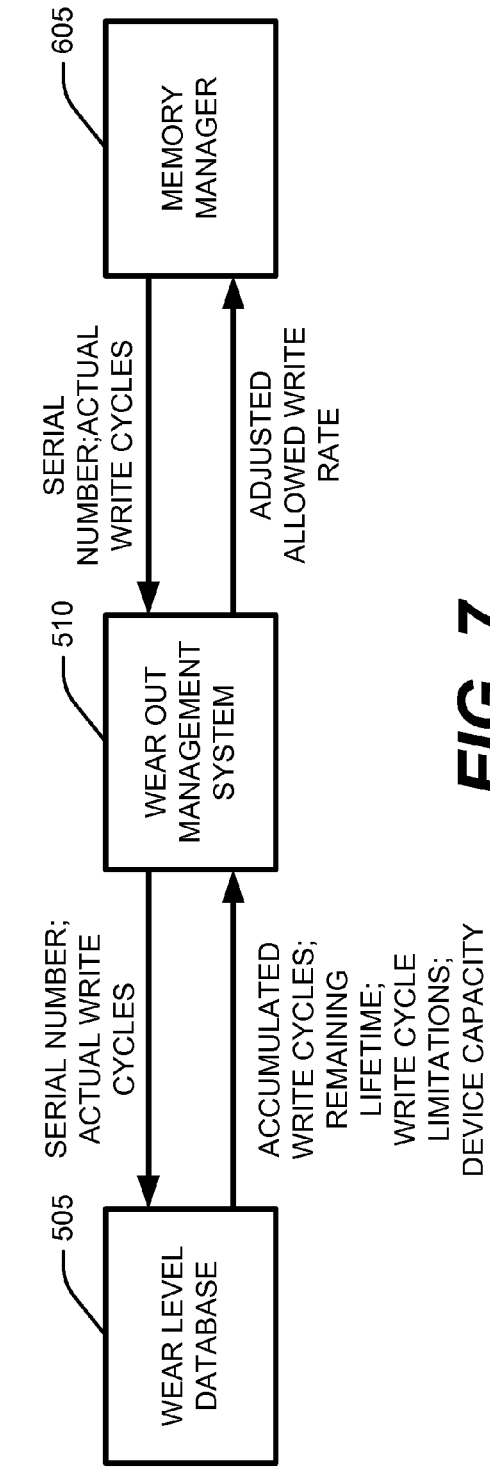

In one embodiment, illustrated in FIG. 7, the memory manager 605 periodically reports the serial number and actual write cycles that have occurred since the last update. In one embodiment, the wear out management system 510 receives that information and stores it in the wear level database 505. In one embodiment, the actual write cycles are stored along with an indication of the time interval over which the writes occurred. In one embodiment, the actual write cycles are added to the current accumulated write cycles for the I/O-limited device and the result is stored in the wear level database 505. In one embodiment, upon receiving an update, or at some other appropriate interval, the wear out management system 510 retrieves the accumulated write cycles, remaining lifetime, write cycle limitations, and device capacity, and computes an adjusted write rate, which it then provides to the memory manager 605.

In one embodiment, the wear out management system 510 adjusts the allowed write rate by accumulating write credits for periods of low activity on a particular I/O-limited device. One embodiment of such an approach, illustrated in FIG. 8, adds and subtracts credits on a periodic basis based on the writes that occurred during the preceding period. In the embodiment shown in FIG. 8, for example, the average write rate to achieve the guaranteed number of writes in the guaranteed lifetime is shown by a dashed line. The actual writes are shown by a solid line that changes periodically when the memory manager reports the writes that have occurred during the preceding period. Credits (indicated by a "+") and debits (indicated by a "−") are shown in the chart below the graph. As can be seen, a credit is earned in the second and third time periods (the credits are recorded under the second and third periods) because of the low activity during those periods, which causes the accumulated credits to increase to 2 credits. Debits are earned during the third and fourth period because of the excessive activity during those periods, which uses the accumulated credits. In the next few periods writes are restricted to drive the actual write line below the average write dashed line. The credits and debits allow the number of writes to be controlled the guaranteed lifetime is reached before the guaranteed number of writes is made.

Figure 9:
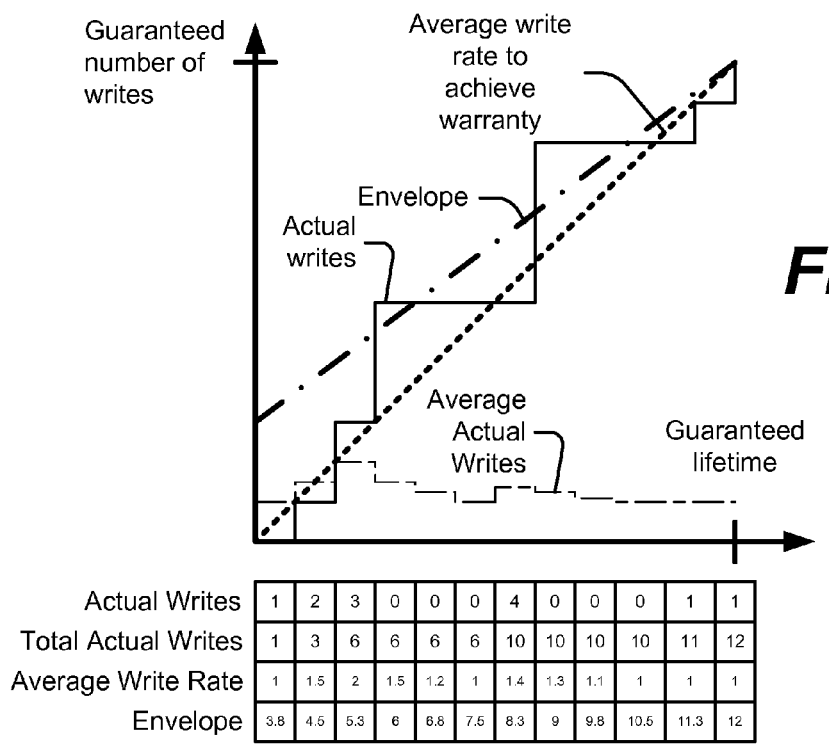

In one embodiment, the wear out management system 510 does not constrain peaks of activity as long as a long term average write rate is within conformance levels. One embodiment of such an approach, illustrated in FIG. 9, includes the same concept of an average write rate to achieve warranty. As long as the average actual writes, shown by the long dash/short dash line in FIG. 9, is below the average write rate to achieve warranty, shown by the dashed line in FIG. 9, peaks in the writes, shown by a dashed line in FIG. 9, above the average write rate to achieve warranty are allowed. FIG. 9 also indicates that the constraint is not applied to the early writes when there is not enough data to establish a long term average write rate.

In one embodiment, also shown in FIG. 9, an envelope, shown by the dash-dot line, is established that intersects the average write rate to achieve warranty line at the guaranteed lifetime but lies above that line. For example, in FIG. 9, the envelope is a line that intersects the average write rate to achieve warranty line at the guaranteed lifetime but has a smaller slope. In one embodiment, if the number of actual writes rises above the envelope and the average actual writes exceed the average write rate to achieve warranty, writes would need to be slowed. This does not happen in FIG. 9.

Figure 10:
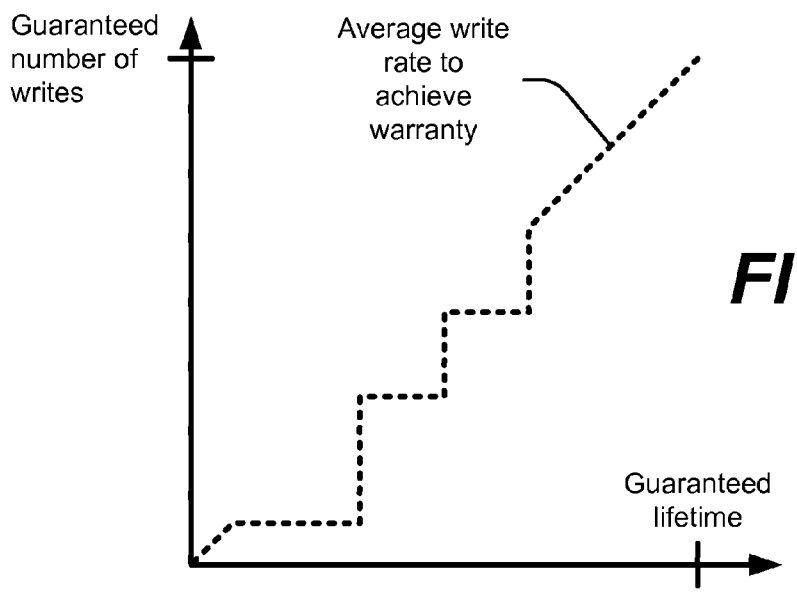
FIG. 10 illustrates a segmented average write rate to achieve warranty.
Figure 11:
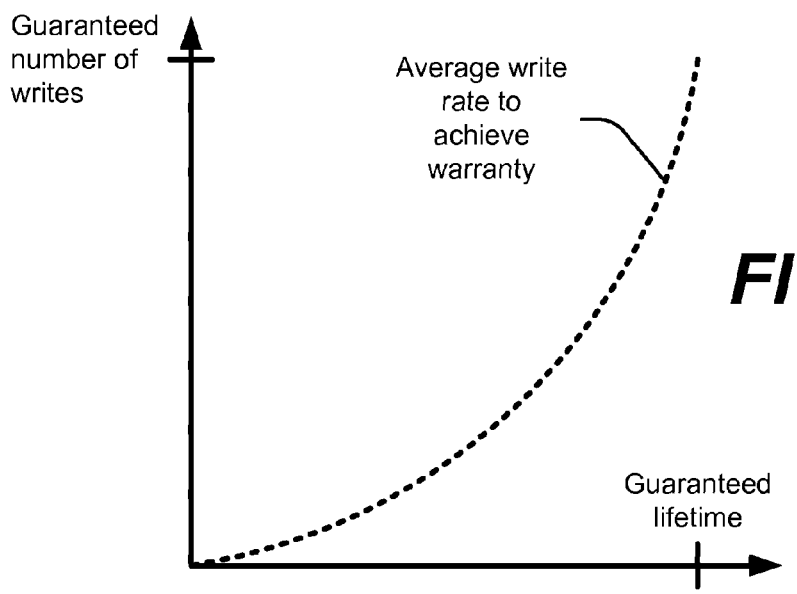
FIG. 11 illustrates a curved average write rate to achieve warranty.

In one embodiment, the wear out management system allows user specification of the allowed peak or average write rates according to a calendar. In one embodiment, this would result in an average write rate to achieve warranty (i.e., the dashed lines in FIGS. 8 and 9) that are not lines but rather are segmented or curved, as shown in FIGS. 10 and 11, or a combination of segmented and curved. In one embodiment, the envelop shown in FIG. 9 is segmented or curved.

In one embodiment, the wear out management system 510 allows the user to change the desired lifetime, where increasing the lifetime would necessitate a decrease in average write rate, and reducing the lifetime would enable an increase in the average write rate.

In one embodiment, the write rate to a I/O-limited device is slowed by temporarily storing the data intended for the I/O-limited device in the memory 215 of the device's memory controller 125, as discussed above.

In one embodiment, data intended for the I/O-limited device to which writes are to be slowed is temporarily or permanently redirected to another I/O-limited device or to another memory. For example, in one embodiment shown in FIG. 5, the input lines 525A-N to the memory managers 515A-N are connected to the bus 115. In one embodiment, the wear out management system 510 assigns the address ranges to which each of the memory managers 515A-N responds. Assume that initially memory manager 515A is assigned to be responsive to data 530A having logical addresses in the range ADDR1-P, and that memory managers 515B-N have not yet been assigned logical address ranges. In that case, the memory manager 515A receives data in that logical address range and stores it 535A in the physical address space of the I/O-limited device to which it is connected. Memory managers 515B-N see the same data on the bus 115 do nothing with it.

Now assume that it is desired to slow the write rate to I/O-limited device 520A and that it is desired to do this by redirecting writes to logical addresses ADDR1-P to one or more I/O-limited device 520B-N. To accomplish this in one embodiment, the wear out management system 510 commands memory manager 515A to stop responding to logical addresses ADDR1-P and divides the responsibility for responding to those logical addresses among one or more of memory managers 515B-N. Then when data 530A arrives, memory manager 515A ignores it and the memory managers 515B-N that have been assigned to be responsive to such data store it in corresponding physical space in their respective I/O-limited devices.

In general, the technique described herein includes counting the number of writes to a device ("$D_{1-n}$") consisting of n sub-devices ("$D_a$"):

$$\begin{bmatrix} W_{1,1} & \dots & W_{1,m-1} & W_{1,m} \\ W_{2,1} & \dots & W_{2,m-1} & W_{2,m} \\ \dots & \dots & \dots & \dots \\ W_{n,1} & \dots & W_{n,m-1} & W_{n,m} \end{bmatrix}$$

where:
 a device can be: (a) a set of I/O-limited devices, in which case a sub-device is a subset of the set of I/O-limited devicea, or (b) a single I/O-limited device, in which case a sub-device is a physical address range within the I/O-limited device;
 $W_{a,b}$ is the number of writes to sub-device $D_a$ in time period "b";
 n>1;
 m>1;
 For each sub-device $D_a$, the technique determines a write rate for sub-device $D_a$ at the end of time period p ("$WR_{a,p}$") using the following equation:

$$WR_{a,p} = \frac{\sum_{b=1}^{p} W_{a,b}}{\sum_{b=1}^{p} t_b}$$

where:
 $t_b$ is the amount of time in time period "b";
 p<m;
 The technique controls the write rate to sub-device $D_a$ in time periods after time period p so that device $D_{1-n}$ will have a guaranteed lifetime ("$LD_{1-n}$").

In one embodiment, controlling the write rate to $D_a$ in time periods after time period p includes controlling the write rate to $D_a$ in time periods after time period p to make the overall write rate computed at the end of a time period q after time period p ("$WR_{a,q}$") less than an allowed overall write rate for Da ("$WA_a$") so that device $D_{1-n}$ will have lifetime $LD_{1-n}$, where:

$$WA_a = \frac{W_{spec}}{LD_{1-n}}, \text{ and}$$

$W_{spec}$ is the specification for the total number of writes to device $D_{1-n}$ in its lifetime.

Figure 8:
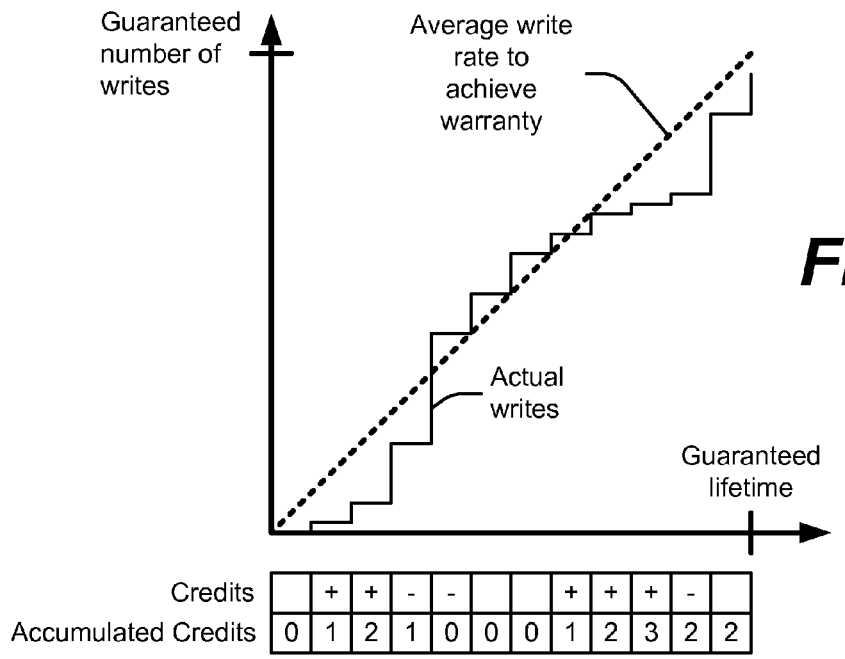
FIGS. 8 and 9 illustrate techniques for allowing peaks in writes.

In one embodiment, controlling the write rate to sub-device $D_a$ in time periods after time period p includes accumulating write rate credits in low write activity time periods for use in high activity time periods, as illustrated in FIG. 8 and its accompanying text.

In one embodiment, controlling the write rate to sub-device $D_a$ in time periods after time period p includes allowing high write rates in time periods while keeping an average write rate for $D_a$ ("$WA_a$") so that device $D_{1-n}$ will have lifetime $LD_{1-n}$, where:

$$WA_a = \frac{W_{spec}}{LD_{1-n}},$$

as illustrated in FIG. 9 and its accompanying text.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method comprising:
   counting a number of writes to a device ("$D_{1-n}$") consisting of n sub-devices ("$D_a$"):

$$\begin{bmatrix} W_{1,1} & \dots & W_{1,m-1} & W_{1,m} \\ W_{2,1} & \dots & W_{2,m-1} & W_{2,m} \\ \dots & \dots & \dots & \dots \\ W_{n,1} & \dots & W_{n,m-1} & W_{n,m} \end{bmatrix}$$

where:
   $W_{a,b}$ is the number of writes to sub-device $D_a$ in time period "b";
   n>1;
   m>1;
   for each sub-device $D_a$:
      determining a write rate for sub-device $D_a$ at the end of time period p ("$WR_{a,p}$") using the following equation:

$$WR_{a,p} = \frac{\sum_{b=1}^{p} W_{a,b}}{\sum_{b=1}^{p} t_b}$$

where:
   $t_b$ is the amount of time in time period "b";
   p<m;
   controlling the write rate to sub-device $D_a$ in time periods after time period p so that device $D_{1-n}$ will have a guaranteed lifetime ("$LD_{1-n}$").

2. The method of claim 1 where controlling the write rate to $D_a$ in time periods after time period p comprises:
   controlling the write rate to $D_a$ in time periods after time period p to make the overall write rate computed at the end of a time period q after time period p ("$WR_{a,q}$") less than an allowed overall write rate for $D_a$ ("$WA_a$") so that device $D_{1-n}$ will have lifetime $LD_{1-n}$, where:

$$WA_a = \frac{W_{spec}}{LD_{1-n}}, \text{ and}$$

$W_{spec}$ is the specification for the total number of writes to device $D_{1-n}$ in its lifetime.

3. The method of claim 2 wherein a curve representing $WA_a$ over time from an origin to $LD_{1-n}$ has a shape selected from a group consisting of a straight line, a segmented line having levels and durations, and a curve.

4. The method of claim 3 further comprising:
   allowing a user to select the levels and durations of the segmented line.

5. The method of claim 1 where controlling the write rate to sub-device $D_a$ in time periods after time period p comprises:
   accumulating write rate credits in low write activity time periods for use in high activity time periods.

6. The method of claim 1 where controlling the write rate to sub-device $D_a$ in time periods after time period p comprises:
   allowing high write rates in time periods while keeping an average write rate for $D_a$ ("$WA_a$") so that device $D_{1-n}$ will have lifetime $LD_{1-n}$, where:

$$WA_a = \frac{W_{spec}}{LD_{1-n}}, \text{ and}$$

$W_{spec}$ is the specification for the total number of writes to device $D_{1-n}$ in its lifetime.

7. The method of claim 6 further comprising:
   allowing a user to adjust $LD_{1-n}$.

8. A database system comprising:
   one or more nodes;
   a plurality of CPUs, each of the one or more nodes providing access to one or more CPUs;
   a plurality of virtual processes, each of the one or more CPUs providing access to one or more virtual processes;
   each virtual process configured to manage data, including rows from the set of database table rows, stored in one of a plurality of data-storage facilities;
   a process to:
      count a number of writes to a device ("$D_{1-n}$") consisting of n sub-devices ("$D_a$"):

$$\begin{bmatrix} W_{1,1} & \cdots & W_{1,m-1} & W_{1,m} \\ W_{2,1} & \cdots & W_{2,m-1} & W_{2,m} \\ \cdots & \cdots & \cdots & \cdots \\ W_{n,1} & \cdots & W_{n,m-1} & W_{n,m} \end{bmatrix}$$

where:
$W_{a,b}$ is the number of writes to sub-device $D_a$ in time period "b";
n>1;
m>1;
for each sub-device $D_a$:
determine a write rate for sub-device $D_a$ at the end of time period p ("$WR_{a,p}$") using the following equation:

$$WR_{a,p} = \frac{\sum_{b=1}^{p} W_{a,b}}{\sum_{b=1}^{p} t_b}$$

where:
$t_b$ is the amount of time in time period "b";
p<m;
control the write rate to sub-device $D_a$ in time periods after time period p so that device $D_{1-n}$ will have a guaranteed lifetime ("$LD_{1-n}$").

9. The database system of claim 8 where, when controlling the write rate to $D_a$ in time periods after time period p, the process:
controls the write rate to $D_a$ in time periods after time period p to make the overall write rate computed at the end of a time period q after time period p ("$WR_{a,q}$") less than an allowed overall write rate for $D_a$ ("$WA_a$") so that device $D_{1-n}$ will have lifetime $LD_{1-n}$, where:

$$WA_a = \frac{W_{spec}}{LD_{1-n}}, \text{ and}$$

$W_{spec}$ is the specification for the total number of writes to device $D_{1-n}$ in its lifetime.

10. The database system of claim 9 wherein a curve representing WAa over time from an origin to $LD_{1-n}$ has a shape selected from a group consisting of a straight line, a segmented line having levels and durations, and a curve.

11. The database system of claim 10 wherein the process further:
allows a user to select the levels and durations of the segmented line.

12. The database system of claim 8 where, when controlling the write rate to sub-device $D_a$ in time periods after time period p, the process:
accumulates write rate credits in low write activity time periods for use in high activity time periods.

13. The database system of claim 8 where, when controlling the write rate to sub-device $D_a$ in time periods after time period p, the process:
allows high write rates in time periods while keeping an average write rate for $D_a$ ("$WA_a$") so that device $D_{1-n}$ will have lifetime $LD_{1-n}$, where:

$$WA_a = \frac{W_{spec}}{LD_{1-n}}, \text{ and}$$

$W_{spec}$ is the specification for the total number of writes to device $D_{1-n}$ in its lifetime.

14. The database system of claim 13 wherein the process further:
allows a user to adjust $LD_{1-n}$.

15. A non-transitory computer-readable medium, storing a computer program comprising executable instructions that cause a computer to:
count a number of writes to a device ("$D_{1-n}$") consisting of n sub-devices ("$D_a$"):

$$\begin{bmatrix} W_{1,1} & \cdots & W_{1,m-1} & W_{1,m} \\ W_{2,1} & \cdots & W_{2,m-1} & W_{2,m} \\ \cdots & \cdots & \cdots & \cdots \\ W_{n,1} & \cdots & W_{n,m-1} & W_{n,m} \end{bmatrix}$$

where:
$W_{a,b}$ is the number of writes to sub-device $D_a$ in time period "b";
n>1;
m>1;
for each sub-device $D_a$:
determine a write rate for sub-device $D_a$ at the end of time period p ("$WR_{a,p}$") using the following equation:

$$WR_{a,p} = \frac{\sum_{b=1}^{p} W_{a,b}}{\sum_{b=1}^{p} t_b}$$

where:
$t_b$ is the amount of time in time period "b";
p<m;
control the write rate to sub-device $D_a$ in time periods after time period p so that device $D_{1-n}$ will have a guaranteed lifetime ("$LD_{1-n}$").

16. The computer program of claim 15 where, when controlling the write rate to $D_a$ in time periods after time period p, the computer:
controls the write rate to $D_a$ in time periods after time period p to make the overall write rate computed at the end of a time period q after time period p ("$WR_{a,q}$") less than an allowed overall write rate for $D_a$ ("$WA_a$") so that device $D_{1-n}$ will have lifetime $LD_{1-n}$, where:

$$WA_a = \frac{W_{spec}}{LD_{1-n}}, \text{ and}$$

$W_{spec}$ is the specification for the total number of writes to device $D_{1-n}$ in its lifetime.

17. The computer program of claim 16 wherein a curve representing WAa over time from an origin to $LD_{1-n}$ has a shape selected from a group consisting of a straight line, a segmented line having levels and durations, and a curve.

18. The computer program of claim 17 further comprising executable instructions that cause a computer to:

allow a user to select the levels and durations of the segmented line.

19. The computer program of claim 15 where, when controlling the write rate to sub-device $D_a$ in time periods after time period p, the computer:
   accumulates write rate credits in low write activity time periods for use in high activity time periods.

20. The computer program of claim 15 where, when controlling the write rate to sub-device $D_a$ in time periods after time period p, the computer:
   allows high write rates in time periods while keeping an average write rate for $D_a$ ("$WA_a$") so that device $D_{1-n}$ will have lifetime $LD_{1-n}$, where:

$$WA_a = \frac{W_{spec}}{LD_{1-n}}, \text{ and}$$

$W_{spec}$ is the specification for the total number of writes to device $D_{1-n}$ in its lifetime.

* * * * *

UNITED STATES PATENT AND TRADEMARK OFFICE
CERTIFICATE OF CORRECTION

PATENT NO. : 8,539,139 B1
APPLICATION NO. : 12/971168
DATED : September 17, 2013
INVENTOR(S) : John Mark Morris Page 1 of 1

It is certified that error appears in the above-identified patent and that said Letters Patent is hereby corrected as shown below:

Title page, item [73]
Assignee should read as follows: Teradata US, Inc.

Signed and Sealed this
Twenty-second Day of October, 2013

Teresa Stanek Rea
*Deputy Director of the United States Patent and Trademark Office*